United States Patent [19]
Böhmer et al.

[11] Patent Number: 5,238,317
[45] Date of Patent: Aug. 24, 1993

[54] PRINTER PROVIDING A FREELY ACCESSIBLE PRINTER FRAME

[75] Inventors: Georg Böhmer, München; Otmar Irro, Feldkirchen-Westerham, both of Fed. Rep. of Germany

[73] Assignee: Siemens Aktiengesellschaft, München, Fed. Rep. of Germany

[21] Appl. No.: 847,085

[22] PCT Filed: Aug. 10, 1990

[86] PCT No.: PCT/DE90/00619
§ 371 Date: May 6, 1992
§ 102(e) Date: May 6, 1992

[87] PCT Pub. No.: WO91/05667
PCT Pub. Date: May 2, 1991

[51] Int. Cl.⁵ .................................. B41J 29/02
[52] U.S. Cl. .................... 400/693; 312/208.3
[58] Field of Search ............ 400/691, 692, 693, 693.1, 400/694, 680, 681, 682, 685; 312/208.1, 208.3, 208.2, 208.4

[56] References Cited

U.S. PATENT DOCUMENTS

| | | | |
|---|---|---|---|
| 3,001,631 | 9/1961 | Fresard | 400/681 |
| 3,288,500 | 11/1966 | Hamel | 287/55 |
| 4,161,017 | 7/1979 | Pierce et al. | 361/412 |
| 4,510,345 | 4/1985 | Costa et al. | 400/693 |
| 4,527,285 | 7/1985 | Kercas et al. | 400/693 |
| 4,531,852 | 7/1985 | Mädge et al. | 400/692 |
| 4,729,681 | 3/1988 | Moser | 400/693 |
| 4,828,417 | 5/1989 | Tano et al. | 400/693 |
| 4,848,941 | 7/1989 | Imaseki | 400/120 |
| 4,851,812 | 7/1989 | Holmberg | 400/680 |
| 5,026,186 | 6/1991 | Hasegawa et al. | 400/693 |

FOREIGN PATENT DOCUMENTS

| | | |
|---|---|---|
| 0001752 | 5/1979 | European Pat. Off. . |
| 0020866 | 1/1981 | European Pat. Off. . |
| 0226326 | 6/1987 | European Pat. Off. . |
| 1812660 | 6/1960 | Fed. Rep. of Germany . |
| 8106810 | 8/1981 | Fed. Rep. of Germany . |
| 0076289 | 5/1983 | Japan ................ 400/693 |
| 61-252181 | 11/1986 | Japan . |
| 0197676 | 8/1988 | Japan ................ 400/680 |
| 486867 | 6/1938 | United Kingdom ........ 400/685 |

OTHER PUBLICATIONS

"Six Point Hinge Mechanism" IBM Technical Disclosure Bulletin, vol. 28, No. 6, Nov. 1985 pp. 2476-2477.
"Combined Cover Support & Interlock Switch", IBM Tech. Discl. Bulletin, vol. 27, No. 1B, Jun. 1984, pp. 565*14 566.

Primary Examiner—Eugene H. Eickholt
Attorney, Agent, or Firm—Kenyon & Kenyon

[57] ABSTRACT

A printer (1) comprises a printer frame (10), which is pivotally mounted in a holding device (110) of a trough-shaped housing base (10), and, in an operating position, is arranged on a support (111) arranged in the trough-shaped housing base (11). For assembly and maintenance work of the printer (1), a pivotally mounted housing flap (15) is provided, which supports the printer frame (10) in an assembly and maintenance position. In the assembly and maintenance position of the printer frame (10), circuit boards (12) which are releasably attached to the printer frame (10) and pivotally arranged in a hinged joint (13) can also be pivoted away from the printer frame (10) for repair and maintenance work.

26 Claims, 4 Drawing Sheets

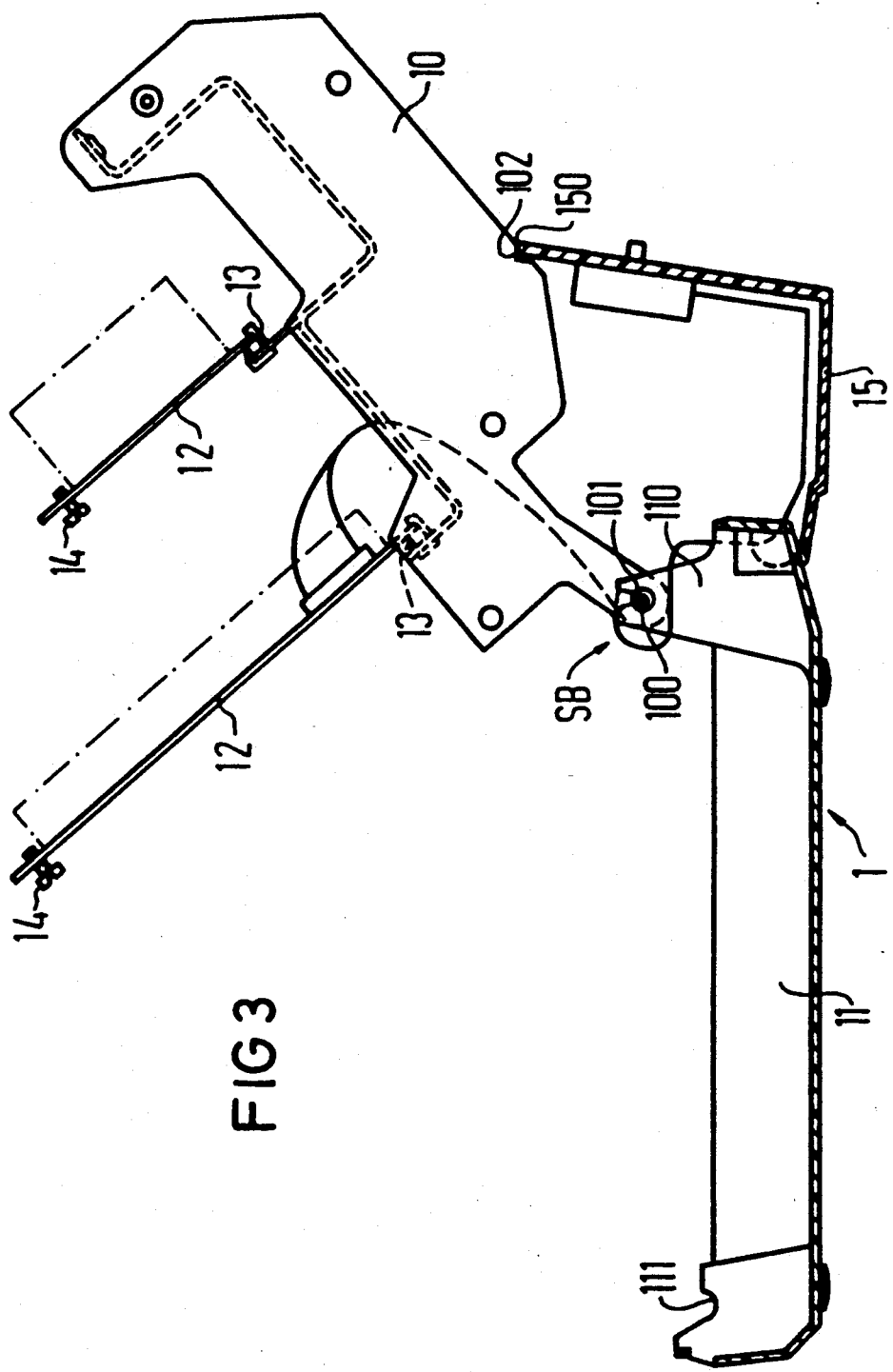

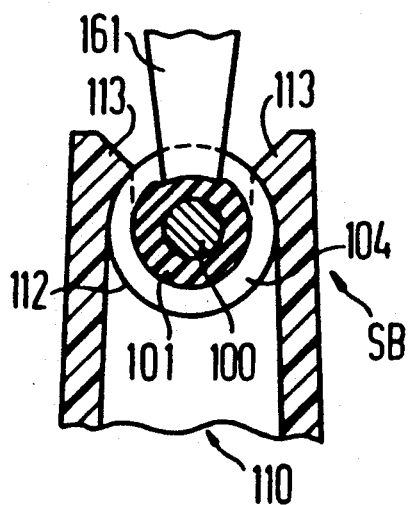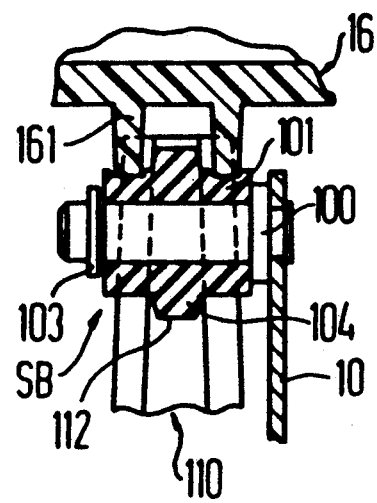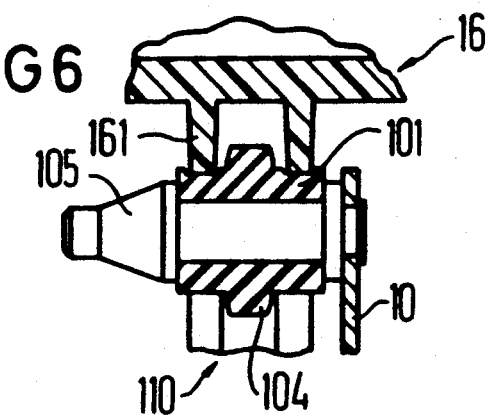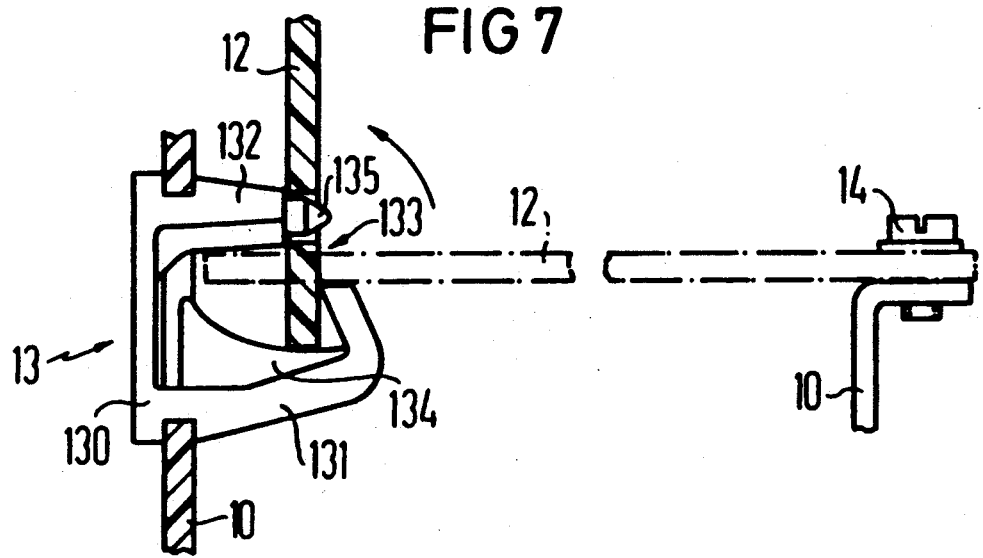

PRINTER PROVIDING A FREELY ACCESSIBLE PRINTER FRAME

BACKGROUND OF THE INVENTION

The present invention relates to a printer having a freely accessible printer frame and more particularly to a printer having a housing base, a housing top, a holding device disposed in the housing base, and a printer frame being pivotally mounted on the holding device wherein the housing top includes a housing flap being pivotally mounted on the housing base so that the housing top can support the printer frame when it is pivoted away from the housing base.

To provide an easily serviceable and maintainable printer, for example an ink jet printer, both the printer frame and flat electronic modules of the printer should be installed in a printer housing, for example made of plastic, in a manner which makes assembly and service as easy as possible. A flat electronic module is understood to mean a printed circuit board or card used for power supply and for printer function control. This flat electronic module is normally disposed in the printer frame and has electronic components assembled on it. In the following, a "printer frame" refers to a seat and support frame for mechanical and electrical modules of the printer. The mechanical and electrical modules include, for example, a printer carriage, a platen, a gear mechanism, a stepper motor, etc.

One possible way of installing the printer frame is to insert it into a trough-shaped housing base via rubber buffers. However, when this installation is used, the circuit boards, which are preferably attached at the bottom of the printer frame, are not easily accessible for assembly, service and inspection.

Another possible way of installing the printer frame is known from the Siemens overview description for a teletypewriter 1000 S dated October 1979 (the disclosure of which is incorporated herein by reference). In this overview description, the teletypewriter is shown in a service position on page 3-1. A printer frame pivoted away from the housing base, supported by a support element, is characteristic for the service position. Because the printer frame is pivoted away, a circuit board located on the housing base, with electronic components assembled on it, is easily accessible for assembly and maintenance work.

Further printers of the stated type are known from U.S. Pat. No. 4,531,852 and DE-GM 81 06 810.

The present invention provides a printer which is easy to assemble and to service, both for a printer frame and for circuit boards.

SUMMARY OF THE INVENTION

The printer of the present invention is made easy to assemble and to service by providing the printer with a housing base, a housing top, a holding device disposed in the housing base, and a printer frame being pivotally mounted on the holding device, wherein the housing top includes a housing flap being pivotally mounted on the housing base so that the housing top can support the printer frame when the frame is pivoted away from the housing base. The printer frame includes circuit boards which are freely accessible when the printer frame is pivoted away from the housing base. These circuit boards are pivotally arranged on the printer frame by a releasably attached hinged joint. Bearing journals, each surrounded by a rubber sleeve, each rubber sleeve preferably having a radially projecting crown, are provided at the pivoting point of the printer frame and the holding device. The printer frame is thereby isolated from any jolts in the housing base or housing top.

The printer frame is freely accessible from all sides for assembly, service, and inspection due to its pivotal mounting to the printer housing. A holding device provided for pivotal mounting is preferably arranged in a trough-shaped housing base, due to the weight of the printer frame (which can be, for example approximately 7 kg). A support is provided for the freely pivoting part of the printer frame. This support is also preferably arranged in the trough-shaped housing base.

A housing flap of the printer housing, preferably also pivotally mounted, is used as a rest so that the pivotally mounted printed frame does not have to be manually held in a service position during assembly and maintenance work. By providing such a rest, no external support device is necessary. By utilizing the above described interaction of the holding device, support and housing flap, a complicated rotation device, which can absorb the high printer frame weight, is not required. Furthermore, the above described interaction of the holding device, the support and the housing flap assures a space-saving arrangement of the printer during service.

To anchor the printer frame to the trough-shaped housing base in the simplest possible manner, the printer frame has two bearing journals which form the pivot axis. These bearing journals are releasably engaged in the holding device which is provided with catch projections.

To insulate the printer frame from jolt stresses that may occur, a rubber sleeve is placed on the bearing journals. Preferably, the rubber sleeve is provided with a radially projecting crown to reinforce the buffer effect thereby absorbing axial forces during the jolt stresses.

By pivotally mounting the printer frame in the printer housing, the circuit boards located at the bottom of the printer frame can be flipped up. The circuit boards are pivotally arranged in a hinged joint and can be attached to the bottom of the printer frame with an attachment element, preferably structured as a captive screw so that the electronic components on the circuit boards are also freely accessible.

BRIEF DESCRIPTION OF THE DRAWINGS

FIGS. 1-3 illustrate various service positions of the printer, in a longitudinal cross-section through a printer, FIGS. 4 and 5 illustrate a first embodiment of a pivot region for a printer frame in the printer according to FIG. 1, in a longitudinal and lateral cross-section, respectively, FIG. 6 illustrates a second embodiment of the pivot region for the printer frame in the printer according to FIG. 1, in a longitudinal cross-section, and FIG. 7 illustrates a cross-section through an attachment device for circuit boards.

DETAILED DESCRIPTION

Figure 1:
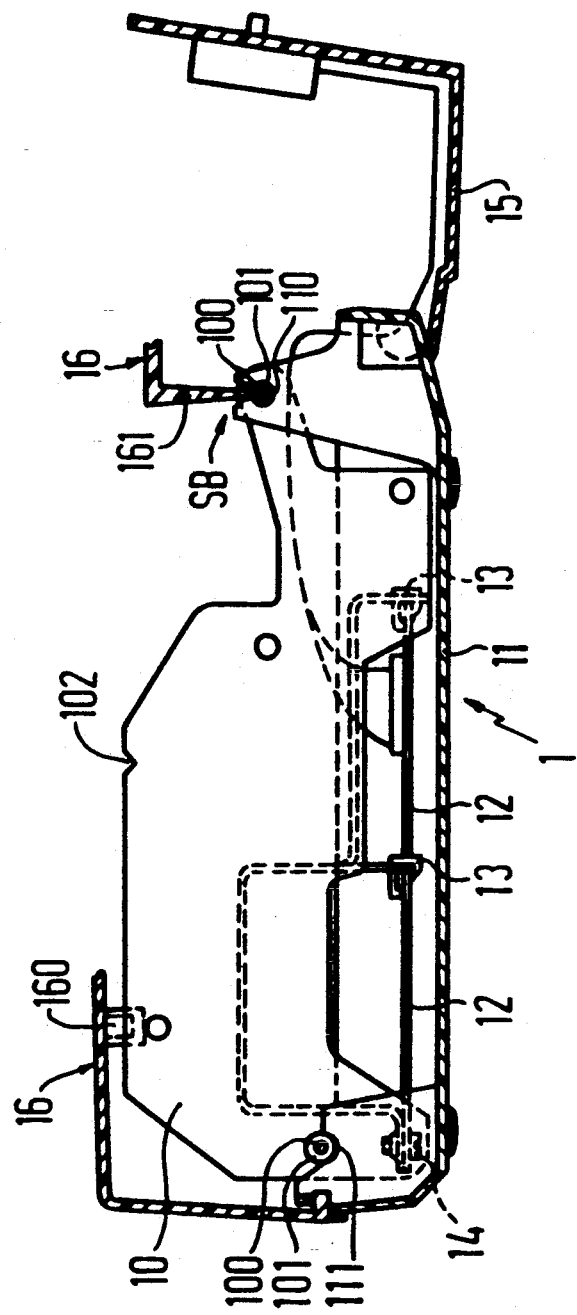
Figure 2:
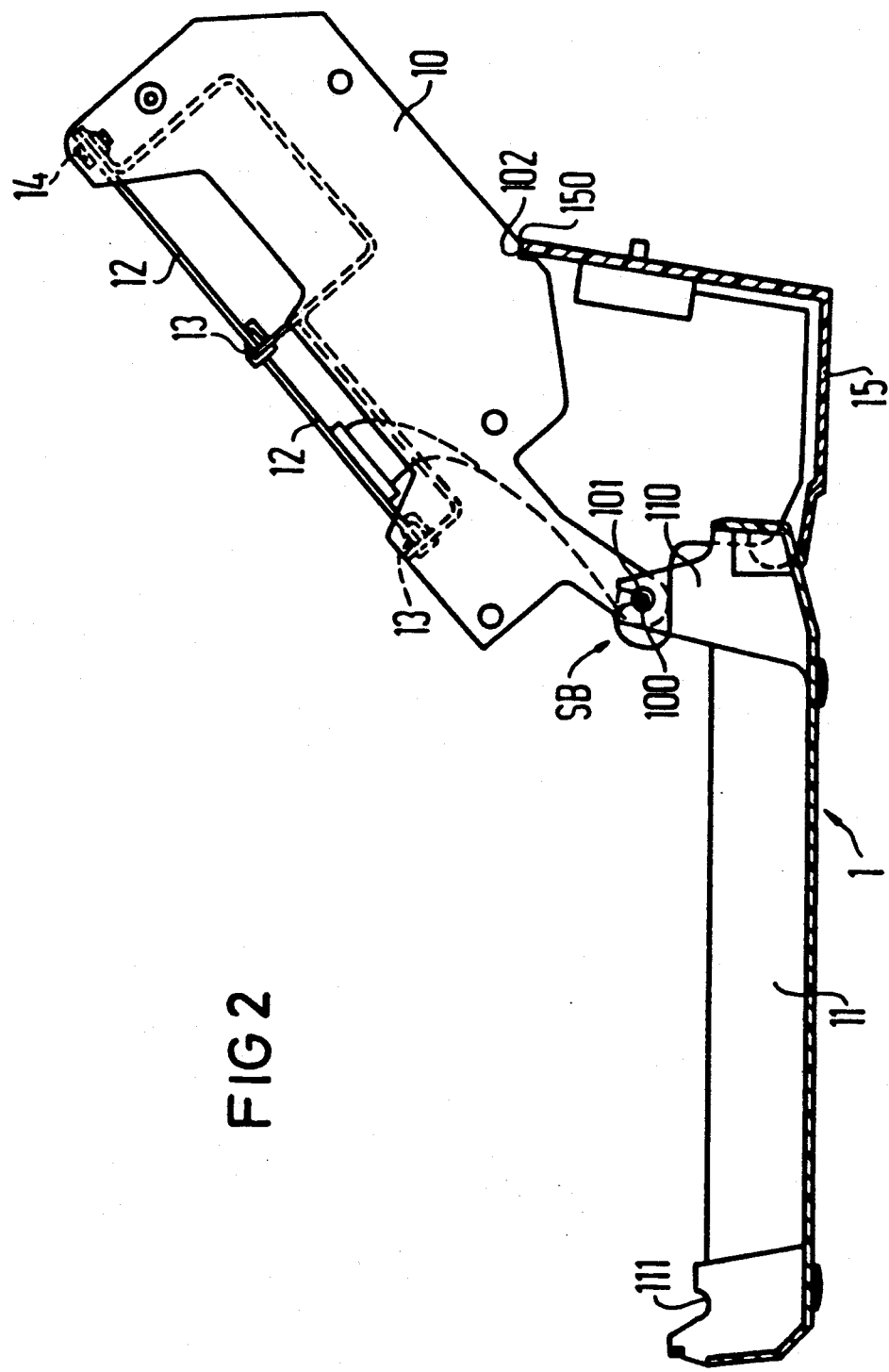

FIGS. 1-3 show different service positions of a printer 1. A printer frame 10 is mounted in a holding device 110 of a trough-shaped housing base 11 with its one end, in a pivot region SB. The printing frame 10 is mounted via two bearing journals 100. These bearing journals are anchored in the printer frame 10 and project laterally outward. Rubber sleeves 101 surrounding the bearing journals 100 absorb axial forces caused by jolt stresses on the printer frame 10. These rubber sleeves are specially structured for this purpose, as will be explained in the description of FIGS. 4 to 6, infra. A depression 111 is arranged in the trough-shaped housing base 11 at an opposite end from the holding device 110. The depression supports the freely pivoting end of the printer frame 10 in an operating position.

The printer frame 10 furthermore has circuit boards 12. These circuit boards are each attached to the bottom of the printer frame 10 with an attachment device comprising a hinged joint 13 and an attachment screw 14. The attachment screw 14 is preferably structured as a captive screw.

A housing flap 15 and a housing cap 16 are provided to protect the printer frame 10 from dust and other contaminants. The housing flap 15 is pivotally mounted in the trough-shaped housing base 11 at one end, at the foot of the holding device 110.

At the opposite side of the printer frame 10 bearing journals 110 with surrounding rubber sleeves 101 are anchored projecting laterally into the printer frame 10, for the support of the printer frame 10.

FIG. 1 shows, in detail, the housing cap 16 arranged or attached on the printer frame 10 or the trough-shaped housing base 11, in a first service position of the printer 1, as well as the housing flap 15 pivoted away from the printer 1. The housing flap 16 has a rubber nub 160 and a rib 161. The rubber nub 160 and the rib 161 are pressed onto the printer frame 10 or onto the rubber sleeve 101 which surrounds the bearing journal 100 when the housing cap 16 locks against the trough-shaped housing base 11. Thus the printer frame 10 is arranged in the trough-shaped housing base 11 free from vibrations.

FIG. 2 shows in detail, in a second service position of the printer 1, how the printer frame 10 is pivoted away after the housing cap 16 is removed, for example for assembly and maintenance work. In this second service position, the printer frame 10 is supported on the housing flap 15, which has been rotated away from the trough-shaped base 11. Differing from FIG. 1, where the printer frame 10 is in the operating position, it is now in an assembly and maintenance position. To ensure that the printer frame 10 is securely supported against the housing flap 15, a notch 102 is formed in the printer frame 10 which an edge 150 of the housing flap 15 engages when pivoted away. The notch 102 extends over the entire printer frame width.

FIG. 3 shows, in detail, in a third service position of the printer 1, how the circuit boards 12 attached on the bottom of the printer frame 10 are pivoted away from the printer frame. This third service position serves as an assembly and maintenance position of the printer frame 10. Again, the circuit board 12 is attached on the printer frame using the hinged joint 13 and the attachement screw 14 as described referring to FIG. 1, infra. To bring the circuit boards into an assembly and maintenance position, the attachment screws 14 are released and the circuit boards, now attached only by the hinged joints 13, are pivoted. While the hinged joint 13 supports the circuit board 12 in a plane parallel to the printer frame 10 in the first and second service positions (see FIGS. 1 and 2, supra) when the circuit board 12 is screwed onto the frame with attachment screws 14, the same hinged support 13 must hold the circuit board 12 in a tilting plane perpendicular to the printer frame 10 when the printer frame is pivoted away from the trough-shaped base (i.e., the third service position), without allowing the circuit board 12 to fall out. The description of FIG. 7 (infra) explains in greater detail how the hinged joint 13 is structured for this purpose.

FIG. 4 shows a longitudinal cross-section of a first embodiment of the pivot region SB. The bearing journal 100 is anchored in the printer frame 10, with the rubber sleeve 101 pushed onto it and is protected against axial slip by a locking ring 103. Thus, the printer frame is locked into the holding device 110. The rubber sleeve 101 is provided with a radially projecting crown 104 in the center, which is additionally pressed against a bushing 112 of the holding device 110 by the ribs 161 of the housing cap 16 so that axial forces occurring during any jolt stresses will be absorbed.

FIG. 5 shows a cross-section of the pivot region SB according to FIG. 4. The bearing journal 100 with the rubber sleeve 101 and the crown 104 is locked into the bushing 112 of the holder 110. The holding device 110 is provided with two opposite catch projections 113 which project into the pivot region SB of the printer frame 10. These catch projections 113 prevent the bearing journal 110 from being lifted out of the holding device 110 when the printer frame 10 is pivoted. The catch projections 113 are formed to be nonelastic. Therefore, when installing the printer frame 10, the crown 104 of the rubber sleeve 101 must be compressed when the bearing journal 100 is pressed forcefully into the holding device 110.

FIG. 6 shows a longitudinal cross-section of a second embodiment of the pivot region SB. In this embodiment, a bearing journal 105 is formed in cone shape at the end opposite the printer frame 10 so that the rubber sleeve 101 can be easily pushed onto the bearing journal 105 when securing the rubber sleeve 101.

FIG. 7 shows, in a side view, how the circuit board 12 is pivotally arranged in the hinged joint 13 and attached on the printer frame 10 in an operating position (i.e., the first service position, see FIG. 1). The hinged joint 13 is a plastic injection-molded part. It consists of a square base plate 130, on which a first molded part 131 and a second molded part 132 are arranged on two opposite sides, each projecting and set off from the edge of the base plate 130. At its free end, the first molded part 131, which projects at a slight slant, is bent around at a right angle to the second molded part 132, thereby forming an opening slit 133 to accommodate the circuit board 12. On the inside surface of the first molded part 131, at a distance x from the base plate 130, a ramp shaped elevation 134 is arranged in the center. The ramp shaped elevation 134 becomes flatter in the direction of the first molded part. A projecting mandrel 135 is arranged on the frontal surface of the second molded part. A depression is provided on the outside surface of the first and second molded part 131, 132, between the base plate 130 and an insertion slant 136. This permits the hinged joint 13 to become locked onto the printer frame since when the hinged joint 13 is pressed into an opening in the printer frame, the depression will engage the edges of the opening.

In the operating position of the circuit board 12 (i.e., first service position, see FIG. 1), the support point contact of the circuit board, both with the first molded part 131 and with the second molded part 132, tightly claims the circuit board 12 in the hinged joint 13.

In the assembly and maintenance position of the circuit board 12 (i.e., third service position, see FIG. 3), in which it is moved in the direction of the arrow as drawn, the circuit board 12 slides along the ramp-shaped elevation 134 pivoting about the edge of the molded part 131 which is bent at a right angle. At the same time, the mandrel 135 is inserted into a bore 120 of the circuit board 12. The mandrel prevents the circuit board 12 from falling out of the hinged joint 13.

We claim:

1. A printer comprising:
   a) a housing base;
   b) a holding device, said holding device being arranged on said housing base;
   c) a housing top, said housing top including a housing flap, said housing flap being pivotally mounted on said housing base; and
   d) a printer frame, said printer frame being pivotally mounted in said holding device and holding modules of the printer, wherein said housing flap supports said printer frame when said printer frame is pivoted away from said housing base.

2. The printer as claimed in claim 1 wherein said printer frame accommodates a circuit board, said circuit board being freely accessible when said printer frame is pivoted away from said housing base.

3. The printer as claimed in claim 2 wherein said printer frame pivotally accommodates said circuit board.

4. The printer as claimed in claim 1 further comprising laterally projecting journals wherein said printer frame is pivotally mounted in said holding device by said laterally projecting journals.

5. The printer as claimed in claim 2 further comprising laterally projecting journals wherein said printer frame is pivotally mounted in said holding device by said laterally projecting journals.

6. The printer as claimed in claim 3 further comprising laterally projecting journals wherein said printer frame is pivotally mounted in said holding device by said laterally projecting journals.

7. The printer as claimed in claim 1 wherein said printer frame is mounted in said holding device in a buffered manner.

8. The printer as claimed in claim 2 wherein said printer frame is mounted in said holding device in a buffered manner.

9. The printer as claimed in claim 3 wherein said printer frame is mounted in said holding device in a buffered manner.

10. The printer as claimed in claim 4 wherein said printer frame is mounted in said holding device in a buffered manner.

11. The printer as claimed in claim 5 wherein said printer frame is mounted in said holding device in a buffered manner.

12. The printer as claimed in claim 6 wherein said printer frame is mounted in said holding device in a buffered manner.

13. The printer as claimed in claim 4 further comprising rubber sleeves, said rubber sleeves being arranged on said laterally projecting journals.

14. The printer as claimed in claim 5 further comprising rubber sleeves, said rubber sleeves being arranged on said laterally projecting journals.

15. The printer as claimed in claim 6 further comprising rubber sleeves, said rubber sleeves being arranged on said laterally projecting journals.

16. The printer as claimed in claim 13 wherein at least one of said rubber sleeves includes a radially projecting crown.

17. The printer as claimed in claim 14 wherein at least one of said rubber sleeves includes a radially projecting crown.

18. The printer as claimed in claim 15 wherein at least one of said rubber sleeves includes a radially projecting crown.

19. The printer as claimed in claim 2 further comprising an attachment device, said attachment device including at least one hinged joint, being attached to said printer frame, and pivotally supporting said circuit board.

20. The printer as claimed in claim 3 further comprising an attachment device, said attachment device including at least one hinged joint, being attached to said printer frame, and pivotally supporting said circuit board.

21. The printer as claimed in claim 5 further comprising an attachment device, said attachment device including at least one hinged joint, being attached to said printer frame, and pivotally supporting said circuit board.

22. The printer as claimed in claim 6 further comprising an attachment device, said attachment device including at least one hinged joint, being attached to said printer frame, and pivotally supporting said circuit board.

23. The printer as claimed in claim 19 wherein said attachment device is releasably attached to said printer frame.

24. The printer as claimed in claim 20 wherein said attachment device is releasably attached to said printer frame.

25. The printer as claimed in claim 21 wherein said attachment device is releasably attached to said printer frame.

26. The printer as claimed in claim 22 wherein said attachment device is releasably attached to said printer frame.

* * * * *